United States Patent [19]
Najle et al.

[11] Patent Number: 5,179,344
[45] Date of Patent: Jan. 12, 1993

[54] PHASE NOISE MEASUREMENTS UTILIZING A FREQUENCY DOWN CONVERSION/MULTIPLIER, DIRECT SPECTRUM MEASUREMENT TECHNIQUE

[75] Inventors: Esteban G. Najle, Smithtown; Robert M. Buckley, Medford, both of N.Y.

[73] Assignee: Harris Corporation, Melbourne, Fla.

[21] Appl. No.: 718,952

[22] Filed: Jun. 21, 1991

[51] Int. Cl.$^5$ ............................................. G01R 27/00
[52] U.S. Cl. .................................. 324/613; 324/622; 455/226.1
[58] Field of Search ...................... 324/613, 622, 77 B, 324/79 R, 78 F, 83 R; 455/226

[56] References Cited
U.S. PATENT DOCUMENTS 4,634,962  1/1987  Banura et al.
4,714,873  12/1987 McPherson et al.
4,748,399  5/1988  Caldwell et al.
4,864,218  9/1989  Leake ................................. 324/613
4,918,373  4/1990  Newberg.

Primary Examiner—Kenneth A. Wieder
Assistant Examiner—Jose M. Solis
Attorney, Agent, or Firm—Scully, Scott, Murphy & Presser

[57] ABSTRACT

An improved circuit for phase noise measurements utilizing a frequency down conversion/multiplier and direct spectrum measurement technique which uses a combination of a phase detector method and a direct spectrum approach. The circuit is particularly useful for field test environments where laboratory instrumentation is normally not available, and fast and accurate phase noise measurements are required. The phase noise measuring circuit includes a frequency mixer which has a first input signal from a device under test and a second input signal from a reference stable oscillator having ultra low phase noise with a fixed center frequency. The frequency mixer mixes the first and second input signals to produce a down converted signal comprising the frequency difference signal of the first and second input signals. A lowpass filter then passes the down converted signal to a frequency doubler circuit which produces a doubled frequency, down converted signal. A lowpass signal filter then passes the doubled frequency, down converted signal to an amplifier. The output of the amplifier is directed to a second frequency doubler circuit which produces a quadrupled frequency, down converted signal. That signal is then directed to a further lowpass filter which passes the quadrupled frequency, down converted signal to a further amplifier. Finally, a direct approach spectrum analyzer analyzes the amplifier output signal which is an intermediate frequency signal in the most sensitive range of the spectrum analyzer for phase noise measurements on the device under test.

20 Claims, 3 Drawing Sheets

PHASE NOISE MEASUREMENTS UTILIZING A FREQUENCY DOWN CONVERSION/MULTIPLIER, DIRECT SPECTRUM MEASUREMENT TECHNIQUE

BACKGROUND OF THE INVENTION

1. Field of the Invention

The present invention relates generally to an improved technique for measuring phase noise, and more particularly pertains to phase noise measurements utilizing a frequency down conversion/multiplier and direct spectrum measurement technique that uses a combination of a phase detector method and a direct spectrum phase noise measurement approach. The subject invention is particularly useful for field test environments where laboratory instrumentation is normally not available and fast and accurate phase noise measurements are required.

2. Discussion of the Prior Art

As the performance of microwave radar and communication systems advances, certain system parameters take on increased performance. One of these parameters that must be measured is the spectral purity of microwave signal sources. In the prior art, many techniques for measuring spectral purity have used complex dedicated instrumentation, often cumbersome in both size and operation. The broadening focus on spectral purity has created a requirement for phase noise measuring techniques which provide the high performance necessary for many environments requiring high precision such as the airborne radar environment.

The most effective way of determining the spectral purity of a signal source is by measuring its Single Side Band phase noise (SSB phase noise), or simply called phase noise.

One particular application wherein phase noise measurements are important is in doppler radar systems which determine the velocity of a target by measuring the small shifts in frequency that the return echo signals have undergone. In actual systems, however, the return signal is much more than just the target echo and includes a large "clutter" signal from the large stationary earth. If the clutter return signal is decorrelated by the delay time difference, phase noise from a local oscillator can partially or even totally mask the target signal. Thus phase noise can set the minimum signal level which must be returned by a target in order to be detectable.

Caldwell et al. U.S. Pat. No. 4,748,399 is similar in several respects to the present invention, but several significant differences exist therebetween.

The present invention is specifically designed for field measurements of phase noise, and special considerations were taken into account with respect to the size and weight of the overall implementation. Several alternative techniques were analyzed and discarded for the same reason as they were too big or too heavy for field applications.

The Caldwell multichannel phase noise measurement system requires two sources to perform a measurement which implies several restrictions. Two Units Under Test (UUTs) are required for a phase noise measurement. This measurement is possible only if both UUTs are multichannel units, which is important considering that the first Intermediate Frequency (IF) is the difference between both channels. Both UUTs cannot have the same frequency, in which case the output of the first mixer would be a base band signal rather than an IF signal. Programmability is required (either manual or remote) to obtain the proper IF signal.

An extra 3 dB error in the measurement has to be taken into consideration if the phase noise of both sources are similar, Also, if the measured phase noise does not meet the required specifications, a third UUT would be required to resolve the ambiguity between the two UUTs being tested.

The subject invention eliminates this problem by using a commercially available, ultra low phase noise source with a fixed center frequency as a second source rather than a second UUT. This yields an advantage of selecting the first IF and phase noise performance according to the UUT requirements. The present invention utilizes a 10 dB margin between the two phase noise sources, which makes the noise contribution of the fixed source less than half a dB, acceptable for field testing. Also, a fixed second source eliminates the need for programmability of the second source, making the field test implementation easier and lighter. If the frequency of interest or phase noise level requirements changes, the fixed source is replaced accordingly.

Another important difference between both approaches is the absence of lowpass filters in the Caldwell system. The approach of the present invention uses lowpass filters after the first mixer and also after each of the two frequency doublers. The first mixer is used as a down converter of the input signal to an Intermediate Frequency (IF) in which all other mixer outputs are considered to be spurious signals and discriminated against by the lowpass filter at its output. The subject invention uses a bandpass filter centered at the IF value so the measurement is not affected (desensitized) by spurious signals. With the same criteria, bandpass filters are used after each doubler.

A third and probably the most significant difference is the final approach used to measure the phase noise. Caldwell et al. utilizes a commercially available frequency synthesizer with a phase lock loop to measure the phase noise in a phase detector method. The UUT signal is down converted into a base band signal, and the final mixer is used as a phase detector. The purpose of the phase lock loop is to maintain a 90° phase difference between the UUT signal and the output of the frequency synthesizer. This is important considering that the phase detector has its highest sensitivity when both signals are in quadrature.

In contrast thereto, the approach of the subject invention uses a combination of a phase detector for the down conversion portion and a direct spectrum method for the phase noise measurement technique. The manner in which the phase noise is measured is substantially different from Caldwell et al. First, the frequency synthesizer and phase lock loop is not required. The UUT signal (down converted, filtered and multiplied up) is sent directly to a spectrum analyzer. Because the phase noise of the signal has already been increased by a known factor, the phase noise can be accurately measured by the spectrum analyzer.

As mentioned hereinabove, the present invention is tailored to field measurement applications in which the utilization of a frequency synthesizer for the last down conversion stage is not recommended due to size and weight limitations. Moreover, the phase lock loop section of the phase detector method requires lengthy and complex calibration routines that makes the phase noise measurement very slow.

Another important factor is that the phase detector method of Caldwell et al. creates a base band signal with equivalent phase noise to that of the UUT. The frequency spectrum analyzer of Caldwell et al. must measure this signal from DC to the highest offset frequency of interest (normally around 1 MHz). This creates problems in field applications as normally field frequency spectrum analyzers are wideband, and the lowest frequency they can measure is around 100 Hz. This implies the use of a second low frequency spectrum analyzer just for the phase noise measurement. The approach of the present invention is not affected by this limitation. The UUT signal remains as an IF signal that falls in the most sensitive range of the spectrum analyzer. The sensitivity of the measurement is determined by the phase noise of the spectrum analyzer Local Oscillator (LO), and the UUT phase noise has been increased over the phase noise of the LO so that a direct spectrum analyzer measurement is acceptable.

SUMMARY OF THE INVENTION

Accordingly, it is a primary object of the present invention to provide phase noise measurements utilizing a frequency down conversion/multiplier, direct spectrum measurement technique.

A further object of the subject invention is the provision of an improved technique for phase noise measurements utilizing a frequency down conversion/multiplier and direct spectrum measurement technique which uses a combination of a phase detector method and a direct spectrum approach, which is particularly useful for field test environments where laboratory instrumentation is normally not available and fast and accurate phase noise measurements are required.

In accordance with the teachings herein, the present invention provides a phase noise measuring circuit for measuring the phase noise of a device under test in which a frequency mixer has a first input signal from a device under test and a second input signal from a reference stable oscillator having ultra low phase noise with a fixed center frequency. The frequency mixer mixes the first and second input signals to produce a down converted signal comprising the frequency difference signal of the first and second input signals. A lowpass filter then passes the down converted signal to a frequency doubler circuit which produces a doubled frequency, down converted signal. A further lowpass signal filter then passes the doubled frequency, down converted signal to an amplifier. The output of the amplifier is directed to a second frequency doubler circuit which produces a quadrupled frequency, down converted signal. That signal is then directed to a further lowpass filter which passes the quadrupled frequency, down converted signal to a further amplifier. Finally, a direct approach spectrum analyzer analyzes the amplifier output signal which is an IF signal in the most sensitive range of the spectrum analyzer for phase noise measurements on the device under test.

In one preferred embodiment, the output of the amplifier is further directed to a second frequency doubler circuit which produces a quadrupled frequency, down converted signal. That signal is then filtered by a lowpass filter which passes the quadrupled frequency, down converted signal to a further amplifier. The output of that amplifier is then directed to the spectrum analyzer which analyzes the signal for phase noise of the device under test.

BRIEF DESCRIPTION OF THE DRAWINGS

The foregoing objects and advantages of the present invention for a phase noise measurement utilizing a frequency down conversion/multiplier and direct spectrum measurement technique may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Discussion of Phase Noise

Frequency stability can be defined as the degree to which an oscillating source produces the same frequency throughout a specified period of time. Every radio frequency (RF) and microwave source exhibits some amount of frequency instability. This stability can be broken down into two components, long term and short term stability.

Long term stability describes the frequency variations that occur over long time periods, expressed in parts per million per hour, day, month or year (PPM/HR, PPM/Day, PPM/Month, PPM/Year). Short term frequency stability contains all elements causing frequency changes about the nominal frequency of less than a few seconds duration. The present invention is concerned with short term frequency stability.

Figure 1:
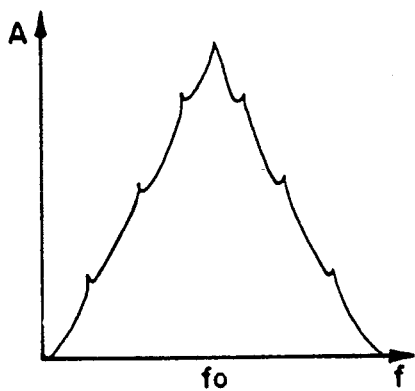
FIG. 1 illustrates a plot of two different types of fluctuating phase terms in a phase noise signal.

Mathematically, an ideal sinewave can be described by:

$$V(t) = Vo \sin 2\pi fot$$

where
Vo = Nominal Amplitude
$2\pi fot$ = Linearly Growing Phase Component
of = Nominal Frequency
but an actual signal is better modeled by:

$$V(t) = |Vo(t)e(t)| SIN |2\pi fot + \Delta\phi(t)|$$

where
e(t) = Amplitude Fluctuations
$\Delta\phi(t)$ = Random Fluctuations Phase Term or Phase Noise The randomly fluctuating phase term can be observed on an ideal spectrum analyzer (one which has no sideband noise of its own). FIG. 1 illustrates a plot of two different types of fluctuating phase terms in a phase noise signal. The first, deterministic, are discrete signals as distinct components in the spectral density plot. These signals, commonly called spurious, can be related to known phenomena in the signal source such as power line frequency, vibration frequencies, or mixer products. The second type of phase instability is random in nature, and is commonly called phase noise. The sources of random sideband noise in an oscillator include thermal noise, shot noise and flicker noise.

Many terms exist to quantify the characteristic randomness of phase noise. Essentially, all methods measure the frequency or phase deviations of the source under test in either the frequency or time domain. Since frequency and phase are related to each other, all of these terms are also related.

One fundamental description of phase instability or phase noise is the one sided spectral density of phase fluctuations on a per hertz basis. The term spectral density describes the energy distribution as a continuous function, expressed in units of energy within a specified bandwidth.

Figure 2:
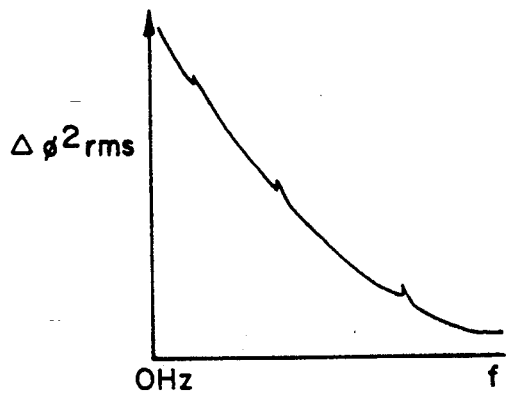
FIG. 2 is an illustration of one sided spectral density of phase fluctuations on a per hertz basis, which is the energy distribution of a signal as a continuous function expressed as units of energy within a specific bandwidth.

Referring to FIG. 2, $S\Delta\phi(f)$ is defined as:

$$S\Delta\phi(f) = \frac{\Delta\phi^2 \text{rms}}{Bw \text{ used to measure } \Delta\phi \text{rms}} \quad \frac{\text{rad}^2}{\text{hz}}$$

If the modulation sidebands are such that the total phase deviations are < 1 radian $\Delta\phi pk$ < 1 rad then another useful measure of the noise energy is $\alpha$ (f) which is then directly related to $S\Delta\phi(f)$ by $\alpha(f) = \frac{1}{2} S\Delta\phi(f)$. $\alpha$ (f) is an indirect measure of noise energy easily related to the RF power spectrum observed on a spectrum analyzer.

Figure 3:
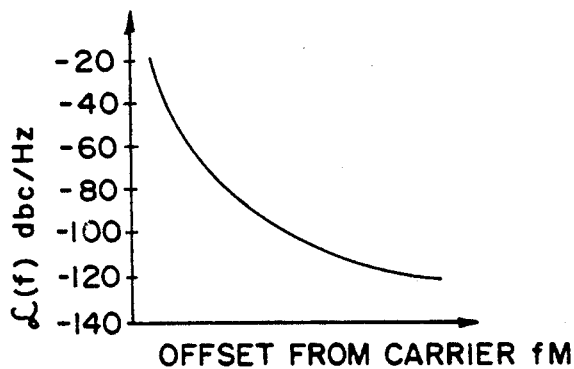
FIG. 3 is a plot of $\alpha$ (f) as the ratio of the power in one phase modulation sideband, on a per hertz of bandwidth spectral density basis to the total signal power, at an offset fm hertz away from the carrier, where fm is the fourier frequency or offset frequency.

As illustrated in FIG. 3, the U.S. National Bureau of Standards defines $\alpha$ (f) as the ratio of the power in one phase modulation sideband, on a per hertz of bandwidth spectral density basis to the total signal power, at an offset fm hertz away from the carrier, where fm is the fourier frequency or offset frequency.

$$\alpha(f) = \frac{\text{Power Density (in one phase modulation sideband)}}{\text{Total Signal Power}} \quad \frac{Pssb}{Ps}$$

Single Sideband (SSB) Phase Noise to Carrier Ratio (Per Hz)

Figure 4:
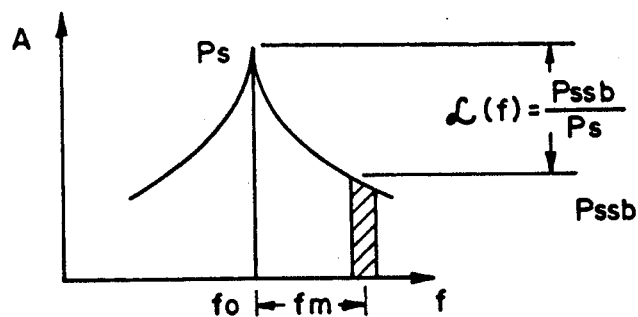
FIG. 4 illustrates $\alpha$ (f) presented logarithmically as a spectral density plot of the phase modulation sidebands in the frequency domain, expressed in db relative to the carrier per Hz (dbc/hz)

Referring to FIG. 4, $\alpha$ (f) is usually presented logarithmically as a spectral density plot of the phase modulation sidebands in the frequency domain, expressed in db relative to the carrier per Hz (dbc/hz). Except where indicated otherwise, the logarithmic form of $\alpha$ (f) is used to describe and graph phase noise.

Another common term for quantifying short term frequency instability is S$\Delta$f(f) the spectral density of frequency fluctuation, related to $\alpha$ (f) as follows:

$$S\Delta f(f) = 2f^2 \alpha(f)$$

Most common measurement systems measure the terms S$\Delta\phi$(f) and S$\Delta$f(f) directly.

Residual and Absolute Noise

Two different kinds of phase noise are commonly specified. Fr devices such as multipliers, mixers, amplifiers and sources that operate from a common reference oscillator, the residual phase noise is that noise inherent in the device, regardless of the noise of the reference oscillator used.

The absolute phase noise of the source or device is the total noise present at the output, and is a function of both the residual phase noise of the device and the reference oscillator noise. It can be seen from this definition that fundamental sources have only absolute noise associated therewith.

The procedures described herein are for making absolute phase noise measurements on microwave sources. In general, it is the absolute phase noise of a source that is important in the final systems application. However, residual noise of devices on synthesized sources is often measured prior to system integration.

Importance of Phase Noise

Phase noise on signal sources is a concern in frequency conversion applications where signal levels span a wide dynamic range. The frequency offset of concern and the tolerable level of noise at this offset vary greatly for different microwave systems. Sideband phase noise can convert into the information bandwidth and limit the overall system sensitivity.

Figure 5:
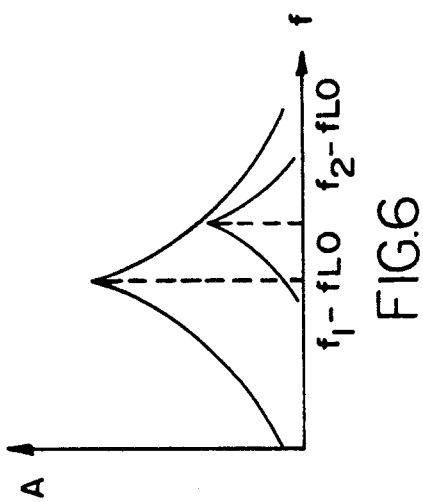
FIG. 5 illustrates a general case of phase noise on signal sources in which two desired signals F1 and F2 are inputs to a frequency conversion system, where they are to be mixed with a local oscillator signal fLO down to an intermediate frequency (IF) for processing.
Figure 6:
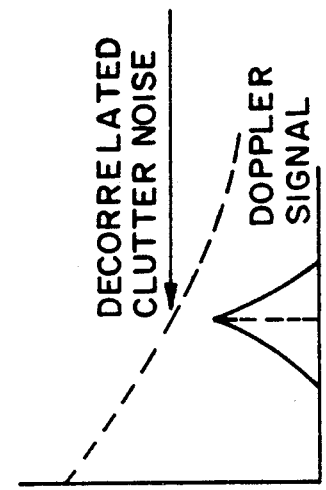
FIG. 6 illustrates the output of FIG. 5 in which the phase noise of the local oscillator is directly translated onto the mixer products.

This general case is illustrated in FIGS. 5 and 6. Suppose two desired signals F1 and F2 are inputs of the frequency conversion system, where they are to be mixed with a local oscillator signal fLO (FIG. 5) down to an intermediate frequency (IF) for processing. The phase noise of the local oscillator will be directly translated onto the mixer products (FIG. 6). Note that though the system's IF filtering may be sufficient to resolve the larger signal's mixing product (f1-fLO), the smaller signal's mixing product (f2-fLO) is no longer recoverable due to the translated local oscillator noise. The noise on the local oscillator thus degrades the system's sensitivity as well as its selectivity.

Doppler Radar System

Figure 7:
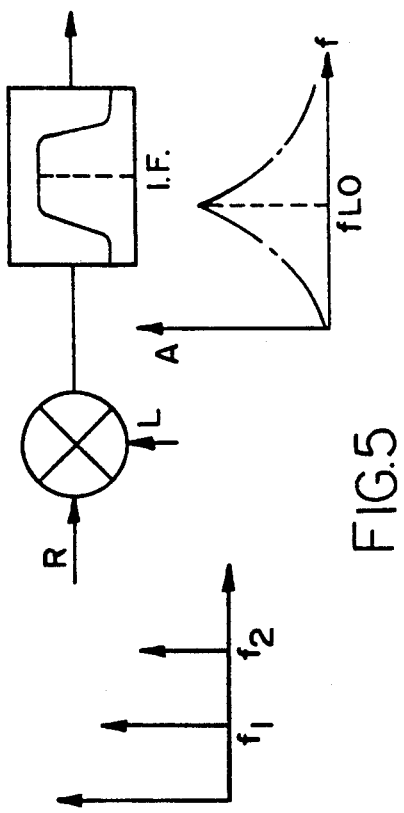
FIG. 7 shows a doppler radar system which determines the velocity of a target by measuring the small shifts in frequency that the return echo signal has undergone.
Figure 8:
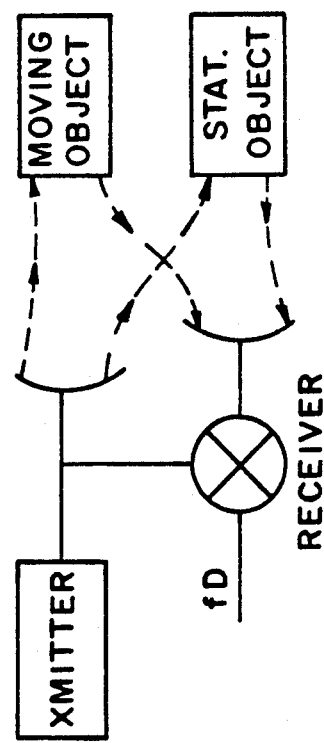
FIG. 8 is a plot of a doppler radar system return echo signal which includes the target echo signal and a large, "clutter" from the large, stationary earth.

A doppler radar system as illustrated schematically in FIG. 7 is a specific example of a frequency conversion application where phase noise is important. Doppler radar systems determine the velocity of a target by measuring the small shifts in frequency that the return echo signals have undergone. In actual systems, however, the return signal is much more than just the target echo signal, and as illustrated in FIG. 8 includes a large, "clutter" signal from the large, stationary earth. If this clutter return signal is decorrelated by the delay time difference, the phase noise from the local oscillator can partially or even totally mask the target signal. Thus phase noise can set the minimum signal level which must be returned by a target in order to be detectable.

Phase Noise Measurement Techniques a. Direct Spectrum Method
b. Phase Detector Method
c. Frequency Discriminator Method
d. Down Converter/Multiplier Direct Spectrum Measurement Method a. Direct Spectrum Measurement Technique The simplest, easiest and perhaps oldest measurement technique for making phase noise measurements of sources is the direct spectrum measurement technique. Here, a signal from a Device Under Test (DUT) is an input signal to a spectrum analyzer tuned to the DUT frequency, directly measuring the power spectral density of the oscillator in terms of $\alpha(f)$.

Spectrum analyzers with a synthesized Local Oscillator (LO) offer the best performance for direct spectrum analysis of phase noise.

When choosing a spectrum analyzer for noise measurements, other factors that should be considered are dynamic range, resolution and frequency range. Dynamic range will determine the level of phase noise that can be measured. Resolution bandwidth is important to resolve spurious signals. Frequency range determines carrier frequencies and the offsets at which phase noise can be measured.

The direct spectrum measurement technique is the simplest of all phase noise measurement techniques, but has several limitations.

Direct Spectrum Measurements Areas of Caution

1. AM noise must be less than phase noise.
2. Limited resolution available for detecting spurs for close-in measurements.
3. Slow sweeptimes prevent measurement of drifting sources.

In summary, the direct spectrum measurement technique for measuring the phase noise on a carrier is an easy, simple technique. It displays $\alpha$) directly, and also accurately displays the discrete signals simultaneously. Unfortunately, it cannot be used to measure very clean (spectrally pure) sources, nor can it measure noisier sources that have either high AM or drift. It is, however, perfect for measuring the phase noise of a stable (typically synthesized or phase-locked) source with relatively high noise sidebands. This technique is best used for quick, qualitative analysis of a device. For example, when a signal generator is initially turned on, the direct spectrum measurement technique can quickly check for misbehavior of the source before using one of the following phase noise measurement techniques.

b. Phase Detector Measurement Technique

The second technique for phase noise measurements is commonly called the phase detector measurement technique (also called the two-source or the quadrature technique). This technique is becoming increasingly popular, as overall it is the most sensitive and broadband.

This technique converts the phase difference between two sources into a voltage which is then measured.

At the heart of this method is the phase detector. Two sources, at the same frequency and in phase quadrature, are inputs to a double-balanced mixer used as a phase detector. The mixer sum frequency ($2f_o$) is filtered off, and the difference frequency is 0 Hz with an average voltage output OV. Superimposed on this DC signal are AC voltage fluctuations proportional to the combined phase noise of the two sources. The baseband signal is often amplified through a low noise amplifier and applied as an input to a baseband spectrum analyzer. In practice, a scope or DC voltmeter is used as quadrature monitor.

The low noise amplifier (LNA) improves the sensitivity and noise figure of the spectrum analyzer. The requirements of this amplifier are determined by levels of phase noise to be measured and the dynamic range of the spectrum analyzer. In general, the amplifier should have a low frequency cutoff well below the lowest offset frequency to be measured. Consideration must also be given to the noise floor and 1/f noise of the amplifier so that additional noise is not introduced into the measurement. The linear input range should extend up to about 30 to 50 dB below the carrier level at the mixer output.

Analog spectrum analyzers are best used for high offset measurements. A digital spectrum analyzer is very useful for close-in offsets with an FFT making fast measurement as close as 1 mHz to the carrier. However, digital spectrum analyzers are limited to offsets of <100 KHz. Therefore, many systems incorporate a combination of both an analog and a digital spectrum analyzer to achieve both fast close-in measurements and far-out measurements.

The phase detector measurement technique removes the limitation of spectrum analyzer noise floors. First, removal of the carrier allows the LNA to amplify the phase noise to increase the usable dynamic range of the spectrum analyzer. Secondly, it translates the noise to baseband where the spectrum analyzer is most sensitive. Therefore, with proper selection of the LNA, the spectrum analyzer does not limit system sensitivity.

The most critical component of the phase detector measurement technique is usually the reference source. Since the spectrum analyzer measures the RMS sum of the noise of both oscillators, the most important criteria for choosing a reference source that its phase noise be less than the phase noise is being measured. The measured noise sets an upper limit; the measured noise will be the maximum noise of either source, and at any particular offset frequency the noise of one of the sources will be at least 3 dB lower.

Although the absolute phase noise is the most important criteria for selection of a reference for the phase detector measurement technique, its AM noise, if very high, will also affect the accuracy of the measurement.

Typical system problems with this approach include:
nonlinear operation of the mixer will result in a calibration error;
saturation of the amplifier or spectrum analyzer while calibrating or by high spurious signal (e.g., line spurs);
deviation from phase quadrature (results in lower $K\phi$); and
noise injected by peripheral circuitry (e.g., power supply) can be a dominant contributor to phase noise.

In summary, the phase detector measurement technique has the best overall system sensitivity. It is a very general purpose solution that is the first choice among measurement techniques for testing many sources.

c. Frequency Discriminator Measurement Technique

The frequency discriminator technique is used to quantify the phase noise of a source without requiring a reference source. This measurement technique is useful for noisier sources which have high-level, low-rate phase noise, or high close-in spurious sidebands, conditions which can pose problems for the phase detector measurement technique. In this method, the frequency fluctuations of the source are translated to baseband voltage fluctuations which can then be measured by a baseband analyzer. $K_d$ the frequency discriminator constant in V/Hz, is defined as the translation factor between the frequency fluctuation at the input of the discriminator and the corresponding voltage output. The fundamental output of the frequency u discriminator can be described by $S_\Delta(f)$, the spectral density of frequency fluctuations.

d. Down Converter/Multiplier Direct Spectrum Measurement Technique

The down converter/multiplier direct spectrum measurement technique is a new measurement technique which uses a combination of the phase detector method and the direct spectrum phase noise measurement approach. It has been specifically designed for field test environments where laboratory instrumentation is normally not available, and fast and accurate phase noise measurement are required.

Figure 9:
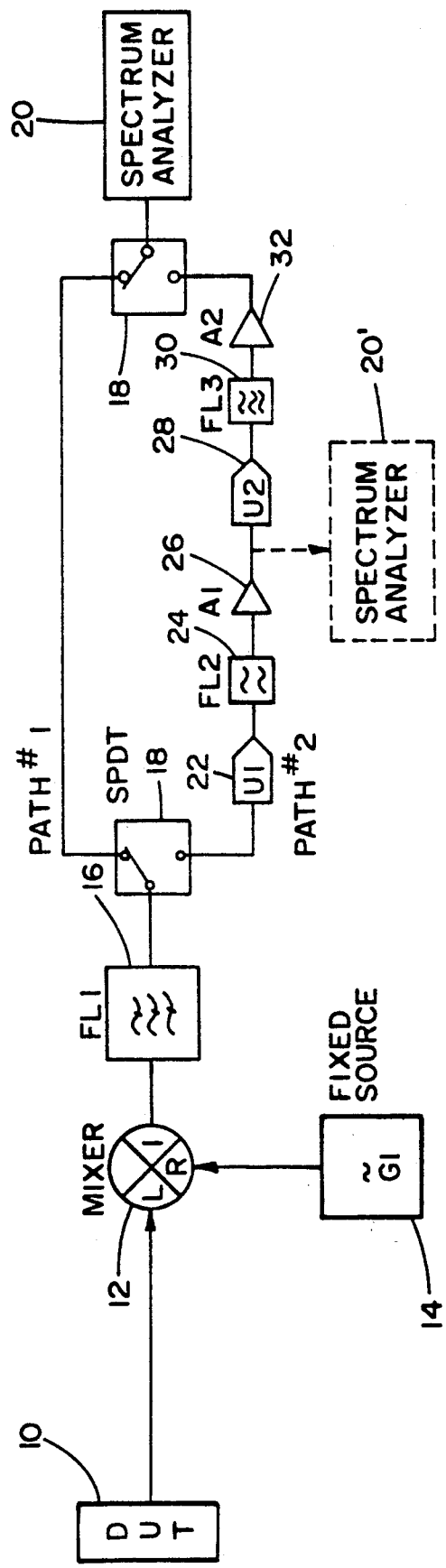
FIG. 9 illustrates a block diagram of one preferred embodiment of a measurement technique pursuant to the teachings of the present invention using a down converter and multiplier in which a signal from a Device Under Test (DUT) is directed to a down converter (double balanced mixer) where the signal from the DUT is mixed down with a clean source.

FIG. 9 illustrates a block diagram of one preferred embodiment of a measurement technique pursuant to the teachings of the present invention using a down conversion/multiplier direct measurement technique in which a signal from a Device Under Test (DUT) 10 is routed to a down converter (double balanced mixer) 12 where the signal from the DUT is mixed down with the output signal from a clean reference stable oscillator 14 having ultra low phase noise which is fixed in frequency. The fixed frequency source 14 is selected so its phase noise contribution to the measurement is negligible, such that the fixed source phase noise is less than that of the DUT by at least 10 dB. The down converted signal is filtered by a lowpass filter 16 which has a bandpass characteristic centered at the frequency of the down converted signal at the difference in frequency between the DUT 10 and reference oscillator 14.

The filtered down converted signal is then fed to a single pole double throw coaxial switch 18 which selects one of two different paths.

Path 1 - simply routes the down converter signal directly to a spectrum analyzer 20 for calibration purposes (set reference).

Path 2 - sends the DUT signal to a frequency doubler (U1) 22, a low pass filter (FL1) 24 having a bandpass characteristic centered at the doubled frequency, and a low noise amplifier (AR1) 26. In a preferred embodiment, this process is repeated again (frequency doubler (U2) 28-filter 30 (centered at the quadrupled frequency)-amplifier 32) in order to bring the original frequency of the DUT up four times to an intermediate frequency signal which is in the most sensitive range of the spectrum analyzer 20. This new signal is directed to the spectrum analyzer 20 for phase noise measurements.

The first part of this technique, the down converter section, is similar to the first down converter stage of the phase detector measurement technique explained hereinabove.

The second part of this technique is unique. Normally at this stage the signal is sent to a second down converter which will create a baseband signal equivalent in phase noise to the DUT signal but at low frequencies (DC to a few MHz). One important reason for conducting phase noise measurements at a very low frequency is to take advantage of the lower phase noise characteristics of the spectrum analyzer local oscillator. The down converter/multiplier measurement technique uses this advantage. The down converter brings the DUT frequency to the most sensitive frequency range of the spectrum analyzer (normally from a few hertz to 2.7 GHz).

The four times multiplication process is carefully designed so the combination down converter multiplier does not bring the DUT frequency above this sensitive range.

For some applications, in an alternative embodiment, after the first down conversion, a direct measurement of the DUT phase noise can be performed as illustrated in phantom in FIG. 9 by the spectrum analyzer 20'. But for some DUTs, even though a low frequency spectrum analyzer LO has its best phase noise characteristics, it is still comparable or higher than the DUT phase noise itself.

A direct spectrum measurement at this time is affected by the LO phase noise and will not be accurate. Every time a signal is multiplied up in frequency, its phase noise is deteriorated by the formula:

$$XdB = 20 \, Log \, N$$

Where N is the multiplication number.

In this technique the signal has been multiplied four times so N=4 and the increase of phase noise of the signal will be:

$$XdB = 20 \, Log \, 4 = 12 \, dB$$

So after the four times multiplication, the DUT signal has its phase noise increased by 12 dB. This important property enables the phase noise measurement to be performed directly with the spectrum analyzer without being affected by the phase noise of the spectrum analyzer LO. After the measurement is performed directly with the spectrum analyzer, the original phase noise of the DUT can be determined by removing 12 dB from the measured number.

With the use of this technique phase noise measurements on DUTs can be extended beyond the spectrum analyzer phase noise LO limitations.

Another advantage of this technique is that the four times multiplication factor makes the offset measurement from the carrier four times further away from its original frequency. So if originally a 10 KHz offset from the carrier was measured, with this technique the same measurement offset will be performed at 40 KHz offset. This is important because the further the signal is moved away from the carrier, the better is the phase noise characteristics of the spectrum analyzer LO.

This measurement technique is limited by two factors. First, the fixed frequency source phase noise characteristic determines the noise floor of the system. Secondly, the combination of down converter/IF frequency and times N multiplication factor will determine the highest frequency measurable with this technique without falling in high, less sensitive spectrum analyzer frequency ranges.

A new phase noise measurement technique has been presented and explained, and the advantages of DUT frequency multiplication have been explained. A substantial reduction in price, time and equipment is accomplished with this simple but practical new technique.

While several embodiments and variations of the present invention for phase noise measurements utilizing a frequency down conversion/multiplier, direct spectrum measurement technique are described in detail herein, it should be apparent that the disclosure and teachings of the present invention will suggest many alternative designs to those skilled in the art.

What is claimed is:

1. A phase noise measuring circuit for measuring the phase noise of a device under test, comprising:
   a. a frequency mixer, having a first input signal from a device under test and a second input signal from a reference stable oscillator having ultra low phase noise and a fixed center frequency, for mixing the first and second input signals to produce a down converted signal comprising the frequency difference signal of the first and second input signals;
   b. a down converted lowpass signal filter for passing the down converted signal;
   c. a frequency doubler circuit for producing a doubled frequency down converted signal;
   d. a doubled frequency, down converted lowpass signal filter for passing the doubled frequency, down converted signal;
   e. an amplifier for amplifying the doubled frequency, down converted output signal; and
   f. a direct approach spectrum analyzer connected directly to said amplifier for analyzing the output signal of said amplifier, and wherein the fixed center frequency of said reference stable oscillator is selected to produce the doubled frequency, down converted output signal having a frequency which is an intermediate frequency signal in the most sensitive range of the spectrum analyzer.

2. A phase noise measuring circuit for measuring the phase noise of a device under test, consisting essentially of:
   a. a frequency mixer, having a first input signal from a device under test and a second input signal from a reference stable oscillator having ultra low phase noise and a fixed center frequency, for mixing the first and second input signals to produce a down converted signal comprising the frequency difference signal of the first and second input signals;
   b. a down converted lowpass signal filter for passing the down converted signal;
   c. a frequency doubler circuit for producing a doubled frequency down converted signal;
   d. a doubled frequency, down converted lowpass signal filter for passing the doubled frequency, down converted signal;
   e. an amplifier for amplifying the doubled frequency, down converted output signal;
   f. a second frequency doubler circuit coupled to the output of said amplifier for producing a quadrupled frequency, down converted signal;
   g. a quadrupled frequency, down converted lowpass signal filter for passing the quadrupled frequency, down converted signal;
   h. a second amplifier for amplifying the quadrupled frequency, down converted signal; and
   i. a direct approach spectrum analyzer connected directly to said amplifier for analyzing the output signal of said amplifier, and wherein the fixed center frequency of said reference stable oscillator is selected to produce the doubled frequency, down converted output signal having a frequency which is an intermediate frequency signal in the most sensitive range of the spectrum analyzer.

3. A phase noise measuring circuit for measuring the phase noise of a device under test as claimed in claim 1, further comprising a coaxial switch coupled between said down converted lowpass signal filter and said frequency doubler circuit, and having a first switch position which passes the output of said down converted lowpass signal filter to said direct approach spectrum analyzer for calibration purposes, and a second switch position which passes the output of said down converted lowpass signal filter to said frequency doubler circuit for a phase noise measurement of the device under test.

4. A phase noise measuring circuit for measuring the phase noise of a device under test as claimed in claim 3, wherein the second input signal from said reference stable oscillator has a phase noise which is less than the phase noise of the device under test by at least 10 dB.

5. A phase noise measuring circuit for measuring the phase noise of a device under test as claimed in claim 1, wherein the second input signal from said reference stable oscillator has a phase noise which is less than the phase noise of the device under test by at least 10 dB.

6. A phase noise measuring circuit for measuring the phase noise of a device under test, comprising:
   a. a frequency mixer, having a first input signal from a device under test and a second input signal from a reference stable oscillator having ultra low phase noise and a fixed center frequency, for mixing the first and second input signals to produce a down converted signal comprising the frequency difference signal of the first and second input signals;
   b. a down converted lowpass signal filter for passing the down converted signal;
   c. a frequency doubler circuit for producing a doubled frequency down converted signal;
   d. a doubled frequency, down converted lowpass signal filter for passing the doubled frequency, down converted signal;
   e. an amplifier for amplifying the doubled frequency, down converted output signal;
   f. a second frequency doubler circuit coupled to the output of said amplifier for producing a quadrupled frequency, down converted signal;
   g. a quadrupled frequency, down converted lowpass signal filter for passing the quadrupled frequency, down converted signal;
   h. a second amplifier for amplifying the quadrupled frequency, down converted signal; and
   i. a direct approach spectrum analyzer connected directly to said amplifier for analyzing the output signal of said amplifier, and wherein the fixed center frequency of said reference stable oscillator is selected to produce the doubled frequency, down converted output signal having a frequency which is an intermediate frequency signal in the most sensitive range of the spectrum analyzer.

7. A phase noise measuring circuit for measuring the phase noise of a device under test as claimed in claim 6, wherein said direct approach spectrum analyzer includes a local oscillator, and the quadrupled frequency of the signal of the device under test produced by the combined actions of said frequency doubler circuit and said second frequency doubler circuit increases the phase noise therein by 12 dB, which enables the spectrum analyzer to directly perform the phase noise measurement without being seriously adversely affected by phase noise of the local oscillator of the spectrum analyzer, and also results in the frequency of the quadrupled frequency, down converted signal being four times further away in frequency from the frequency of the down converted signal, which results in improved phase noise characteristics of the direct approach spectrum analyzer local oscillator at the frequency of the quadrupled frequency, down converted signal.

8. A phase noise measuring circuit for measuring the phase noise of a device under test as claimed in claim 7, further comprising a coaxial switch coupled between said down converted lowpass signal filter and said frequency doubler circuit, and having a first switch position which passes the output of said down converted lowpass signal filter to said direct approach spectrum analyzer for calibration purposes, and a second switch position which passes the output of said down converted lowpass signal filter to said frequency doubler circuit for a phase noise measurement of the device under test.

9. A phase noise measuring circuit for measuring the phase noise of a device under test as claimed in claim 8, wherein the second input signal from said reference stable oscillator has a phase noise which is less than the phase noise of the device under test by at least 10 dB.

10. A phase noise measuring circuit for measuring the phase noise of a device under test as claimed in claim 6, further comprising a coaxial switch coupled between said down converted lowpass signal filter and said frequency doubler circuit, and having a first switch position which passes the output of said down converted lowpass signal filter to said direct approach spectrum analyzer for calibration purposes, and a second switch position which passes the output of said down converted lowpass signal filter to said frequency doubler circuit for a phase noise measurement of the device under test.

11. A phase noise measuring circuit for measuring the phase noise of a device under test as claimed in claim 6, wherein the second input signal from said reference stable oscillator has a phase noise which is less than the phase noise of the device under test by at least 10 dB.

12. A phase noise measuring circuit for measuring the phase noise of a device under test, consisting essentially of:
   a. a frequency mixer, having a first input signal from a device under test and a second input signal from a reference stable oscillator having ultra low phase noise and a fixed center frequency, for mixing the first and second input signals to produce a down converted signal comprising the frequency difference signal of the first and second input signals;
   b. a down converted lowpass signal filter for passing the down converted signal;
   c. a frequency doubler circuit for producing a doubled frequency down converted signal;
   d. a doubled frequency, down converted lowpass signal filter for passing the doubled frequency, down converted signal;
   e. an amplifier for amplifying the doubled frequency, down converted output signal; and
   f. a direct approach spectrum analyzer connected directly to said amplifier for analyzing the output signal of said amplifier, and wherein the fixed center frequency of said reference stable oscillator is selected to produce the doubled frequency, down converted output signal having a frequency which is an intermediate frequency signal in the most sensitive range of the spectrum analyzer.

13. A phase noise measuring circuit for measuring the phase noise of a device under test as claimed in claim 12, further consisting essentially of a coaxial switch coupled between said down converted lowpass signal filter and said frequency doubler circuit, and having a first switch position which passes the output of said down converted lowpass signal filter to said direct approach spectrum analyzer for calibration purposes, and a second switch position which passes the output of said down converted lowpass signal filter to said frequency doubler circuit for a phase noise measurement of the device under test.

14. A phase noise measuring circuit for measuring the phase noise of a device under test as claimed 13, wherein the second input signal from said reference stable oscillator has a phase noise which is less than the phase noise of the device under test by at least 10 dB.

15. A phase noise measuring circuit for measuring the phase noise of a device under test as claimed in claim 12, wherein the second input signal from said reference stable oscillator has a phase noise which is less than the phase noise of the device under test by at least 10 dB.

16. A phase noise measuring circuit for measuring the phase noise of a device under test as claimed 2, wherein the second input signal from said reference stable oscillator has a phase noise which is less than the phase noise of the device under test by at least 10 dB.

17. A phase noise measuring circuit for measuring the phase noise of a device under test as claimed in claim 2, wherein said direct approach spectrum analyzer includes a local oscillator, and the quadrupled frequency of the signal of the device under test produced by the combined actions of said frequency doubler circuit and said second frequency doubler circuit increases the phase noise therein by 12 dB, which enables the spectrum analyzer to directly perform the phase noise measurement without being seriously adversely affected by phase noise of the local oscillator of the spectrum analyzer, and also results in the frequency of the quadrupled frequency, down converted signal being four times further away in frequency from the frequency of the down converted signal, which results in improved phase noise characteristics of the direct approach spectrum analyzer local oscillator at the frequency of the quadrupled frequency, down converted signal.

18. A phase noise measuring circuit for measuring the phase noise of a device under test as claimed in claim 17, further consisting essentially of a coaxial switch coupled between said down converted lowpass signal filter and said frequency doubler circuit, and having a first switch position which passes the output of said down converted lowpass signal filter to said direct approach spectrum analyzer for calibration purposes, and a second switch position which passes the output of said down converted lowpass signal filter to said frequency doubler circuit for a phase noise measurement of the device under test.

19. A phase noise measuring circuit for measuring the phase noise of a device under test as claimed 18, wherein the second input signal from said reference stable oscillator has a phase noise which is less than the phase noise of the device under test by at least 10 dB.

20. A phase noise measuring circuit for measuring the phase noise of a device under test as claimed in claim 2, further consisting essentially of a coaxial switch coupled between said down converted lowpass signal filter and said frequency doubler circuit, and having a first switch position which passes the output of said down converted lowpass signal filter to said direct approach spectrum analyzer for calibration purposes, and a second switch position which passes the output of said down converted lowpass signal filter to said frequency doubler circuit for a phase noise measurement of the device under test.

* * * * *

UNITED STATES PATENT AND TRADEMARK OFFICE
CERTIFICATE OF CORRECTION

PATENT NO. : 5,179,344                           Page 1 of 2
DATED     : January 12, 1993
INVENTOR(S): Esteban Najle, et al.

It is certified that error appears in the above-identified patent and that said Letters Patent is hereby corrected as shown below:

Column 4, lines 20 & 25: " α " should read as -- ∝ --

Column 5, line 11: "of" should read as --fo--

Column 5, line 52, in both instances: " < " should read as -- ≪ --

Column 5, lines 53, 54, 59 & 66: " α " should read as -- ∝ --

Column 6, lines 4, 8, 12 & 14: " α " should read as -- ∝ --

Column 6, line 21: "Fr" should read as --For--

Column 7, line 23: " α " should read as -- ∝ --

Column 7, line 47: " α " should read as -- ∝ --

Column 7, line 52: "of" should read as --on--

Column 8, line 46: after "source" insert --is--

UNITED STATES PATENT AND TRADEMARK OFFICE
CERTIFICATE OF CORRECTION

PATENT NO. : 5,179,344

DATED : January 12, 1993

INVENTOR(S) : Esteban Najle, et al.

It is certified that error appears in the above-identified patent and that said Letters Patent is hereby corrected as shown below:

Column 9, line 15: after "frequency" delete -- $\mu$ --

Column 12, line 55, Claim 6: after "said" insert --second--

Column 14, line 17, Claim 14: after "claimed" insert --in claim--

Column 14, line 22, Claim 15: after "claimed" insert --in claim--

Column 14, line 62, Claim 19: after "claimed" insert --in claim--

Signed and Sealed this

Twenty-third Day of November, 1993

Attest:

BRUCE LEHMAN

*Attesting Officer*  *Commissioner of Patents and Trademarks*